United States Patent
Vanderwees et al.

(10) Patent No.: US 11,614,289 B2
(45) Date of Patent: Mar. 28, 2023

(54) ALUMINUM HEAT EXCHANGER WITH SOLDERABLE OUTER SURFACE LAYER

(71) Applicant: Dana Canada Corporation, Oakville (CA)

(72) Inventors: Doug Vanderwees, Mississauga (CA); Meinrad K. A. Machler, Oakville (CA)

(73) Assignee: DANA CANADA CORPORATION, Oakville (CA)

( * ) Notice: Subject to any disclaimer, the term of this patent is extended or adjusted under 35 U.S.C. 154(b) by 446 days.

(21) Appl. No.: 16/748,436

(22) Filed: Jan. 21, 2020

(65) Prior Publication Data
US 2021/0222967 A1    Jul. 22, 2021

(51) Int. Cl.
| | |
|---|---|
| *F28F 21/08* | (2006.01) |
| *B23K 1/00* | (2006.01) |
| *H01L 23/473* | (2006.01) |
| *H05K 7/20* | (2006.01) |
| *H01L 21/48* | (2006.01) |
| *B23K 103/10* | (2006.01) |
| *B23K 103/12* | (2006.01) |

(52) U.S. Cl.
CPC .......... *F28F 21/089* (2013.01); *B23K 1/0012* (2013.01); *F28F 21/084* (2013.01); *H01L 21/4882* (2013.01); *H01L 23/473* (2013.01); *H05K 7/20927* (2013.01); *B23K 2103/10* (2018.08); *B23K 2103/12* (2018.08); *F28F 2275/04* (2013.01); *H05K 7/20872* (2013.01)

(58) Field of Classification Search
CPC .... F28F 21/089; F28F 21/084; B23K 1/0012; B23K 2103/10; B23K 2103/12; H01L 21/4882; H01L 23/473; H05K 7/20927; H05K 7/20872

USPC .......................................... 165/80.4, 104.31
See application file for complete search history.

(56) References Cited

U.S. PATENT DOCUMENTS

| | | | |
|---|---|---|---|
| 5,796,049 A | 8/1998 | Schneider | |
| 6,913,184 B2* | 7/2005 | Dockus ............. | B23K 35/0238 |
| | | | 228/56.3 |
| 7,000,823 B2 | 2/2006 | Dockus et al. | |
| (Continued) | | | |

FOREIGN PATENT DOCUMENTS

JP    2008016567 A    1/2008

OTHER PUBLICATIONS

English Translation of JP 2008016567 Jan. 24, 2008.

*Primary Examiner* — Tho V Duong
(74) *Attorney, Agent, or Firm* — Ridout & Maybee LLP

(57) ABSTRACT

An aluminum heat exchanger includes first and second plates with inner and outer surfaces, which are joined by brazing and define at least one fluid flow passage. The first and second plates each comprise a core layer of aluminum or an aluminum alloy having a melting temperature greater than an aluminum brazing temperature. The first plate also includes a first outer clad layer defining the outer surface of the first plate. The first outer clad layer is solderable to a metal layer of an object to be cooled and includes nickel or copper. A second outer clad layer is located between the first outer clad layer and the core layer and is roll bonded to at least the second outer clad layer. A manufacturing method includes brazing first and second plates, where the layers of the first plate are roll bonded and the first plate is optionally formed before brazing.

22 Claims, 7 Drawing Sheets

(56) References Cited

U.S. PATENT DOCUMENTS

| | | | |
|---|---|---|---|
| 7,182,125 B2* | 2/2007 | Martin | F28D 1/0383 |
| | | | 165/170 |
| 7,755,185 B2 | 7/2010 | Bayerer et al. | |
| 8,081,465 B2 | 12/2011 | Nishiurra | |
| 8,405,992 B2 | 3/2013 | Yesin et al. | |
| 9,417,011 B2 | 8/2016 | Burgers et al. | |
| 9,829,256 B2 | 11/2017 | Abels | |
| 10,475,724 B2 | 11/2019 | Maehler et al. | |
| 10,531,594 B2 | 1/2020 | Reeves et al. | |
| 2002/0050511 A1* | 5/2002 | Wittebrood | B23K 35/286 |
| | | | 420/548 |
| 2004/0035911 A1* | 2/2004 | Dockus | B23K 35/002 |
| | | | 228/56.3 |
| 2009/0184152 A1 | 7/2009 | Kimbara | |
| 2010/0206537 A1 | 8/2010 | Ikeda et al. | |
| 2011/0235279 A1* | 9/2011 | Mori | H01L 23/3735 |
| | | | 361/717 |
| 2012/0045660 A1* | 2/2012 | Matsukado | F28F 21/084 |
| | | | 428/654 |
| 2014/0339288 A1* | 11/2014 | Otaki | B23K 20/04 |
| | | | 228/117 |
| 2016/0035660 A1* | 2/2016 | Terasaki | H01L 23/49838 |
| | | | 174/257 |
| 2018/0042137 A1 | 2/2018 | Reeves et al. | |
| 2020/0321224 A1* | 10/2020 | Kubota | H01L 25/07 |

* cited by examiner

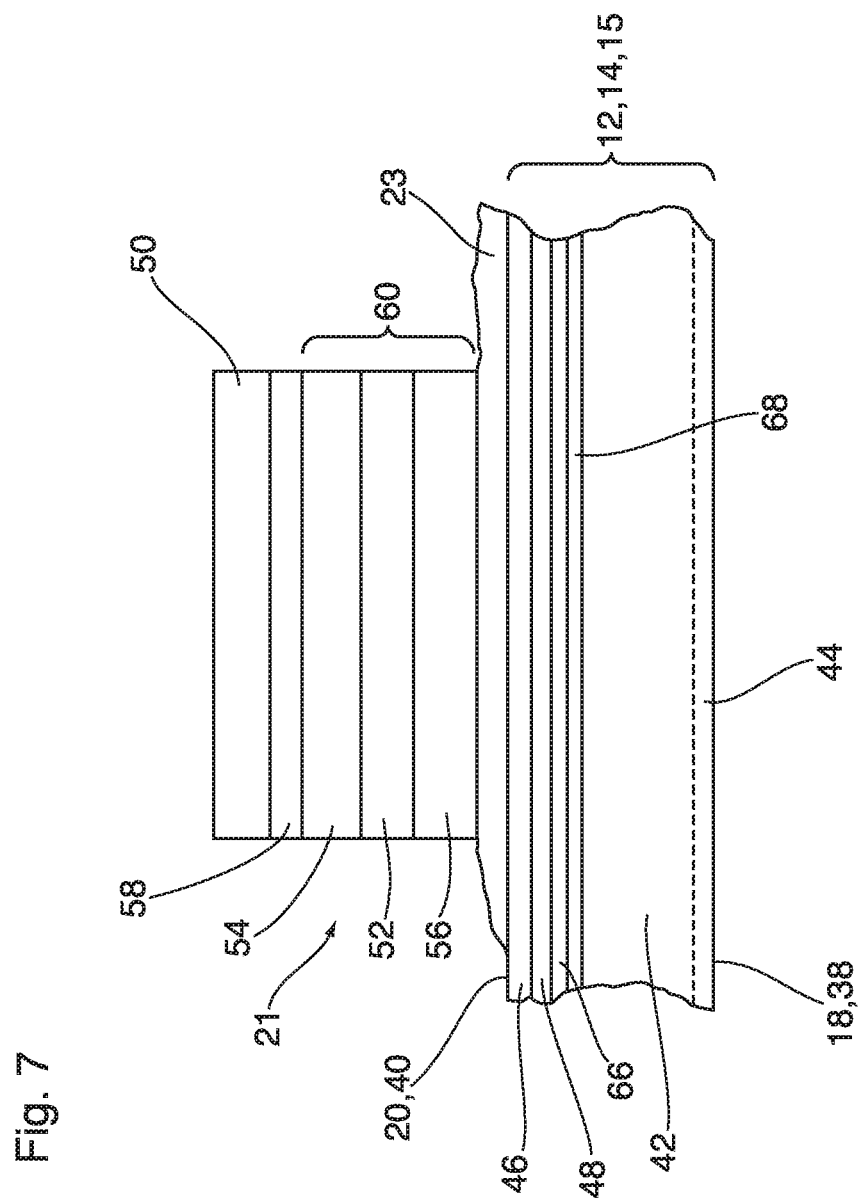

ALUMINUM HEAT EXCHANGER WITH SOLDERABLE OUTER SURFACE LAYER

TECHNICAL FIELD

The present disclosure relates to heat exchanger construction, particularly to a heat exchanger having an outer surface to which objects may be directly bonded, for example by soldering or sintering, and to methods for its construction.

BACKGROUND

Electric vehicles ("EV") and hybrid electric vehicles ("HEV") employ power electronics devices which generate significant amounts of heat energy. This heat energy must be dissipated to avoid excessive heating of these devices, which could lead to damage or reduced performance.

Automotive power electronics devices typically include one or more heat-generating electronic components such as transistors, resistors, capacitors, field effect transistors (FETS), isolated gate bipolar transistors (IGBTs), power inverters, DC to DC converters and DC to AC converters. These components may be mounted on the outer surface of a heat exchanger, for example with a thin layer of thermal interface material (TIM) provided at the interface between the power electronics device and the outer surface of the heat exchanger in order to improve thermal contact. The TIM may comprise a thermally conductive grease, wax or metallic material.

However, thermal conductivity between the electronics device and the heat exchanger can be affected by a number of factors including contact pressure, thickness of the TIM layer and/or the presence of voids. Therefore, there remains a need for improved thermal contact between a heat exchanger and power electronics devices.

SUMMARY

In accordance with an aspect of the present disclosure, there is provided a brazed heat exchanger comprising: (a) a first plate having an inner surface and an outer surface; (b) a second plate having an inner surface and an outer surface; (c) a peripheral edge along which the inner surfaces of the first and second plates have been joined together by brazing at an aluminum brazing temperature; and (d) at least one fluid flow passage defined between the inner surfaces of the first and second plates.

According to an embodiment, the first plate and the second plate each comprise a core layer, wherein the core layer comprises aluminum or an aluminum alloy, and has a melting temperature greater than an aluminum brazing temperature.

According to an embodiment, the first plate further comprises: a first outer clad layer defining the outer surface of the first plate, wherein the first outer clad layer is solderable to a metal layer of an object to be cooled and comprises nickel, a nickel alloy, copper or a copper alloy; and a second outer clad layer located between the first outer clad layer and the core layer, wherein the first outer clad layer is roll bonded to the second outer clad layer.

According to an embodiment, the first outer clad layer has a thickness of about 25-250 μm, for example about 50-150 μm.

According to an embodiment, the first outer clad layer comprises copper or a copper alloy; wherein the second outer clad layer is roll bonded to the core layer and to the first outer clad layer; and wherein the second outer clad layer comprises nickel, a nickel alloy, stainless steel, high nickel steel, or mild steel.

According to an embodiment, the second outer clad layer has a thickness from greater than 10 μm to about 150 μm.

According to an embodiment, the second outer clad layer comprises aluminum or an aluminum alloy and has a melting temperature greater than the aluminum brazing temperature; and the first plate further comprises a third outer clad layer; wherein the third outer clad layer is roll bonded to the second outer clad layer; and wherein the third outer clad layer comprises nickel or a nickel alloy.

According to an embodiment, the third outer clad layer is also roll bonded to the core layer.

According to an embodiment, the thickness of the first outer clad layer is the same as the thickness of the third outer clad layer, or the thicknesses of the first and third layers are within about ±25% of each other.

According to an embodiment, the second outer clad layer is thinner than the core layer.

According to an embodiment, the first plate further comprises a first inner clad layer defining the inner surface of the first plate and comprising an aluminum alloy which melts and forms a filler metal at the aluminum brazing temperature.

According to an embodiment, the first plate further comprises a second inner clad layer which is roll bonded directly to an opposite side of the core layer to the first outer clad layer, and which comprises nickel or a nickel alloy.

According to an embodiment, the first plate further comprises a third outer clad layer roll bonded to the second outer clad layer, and a fourth outer clad layer roll bonded to the third outer clad layer; and the third outer clad layer comprises aluminum or an aluminum alloy and has a melting temperature greater than the aluminum brazing temperature; and the fourth outer clad layer comprises nickel, a nickel alloy, stainless steel, high nickel steel, or mild steel.

According to an embodiment, both the second and the fourth outer clad layers comprise nickel or nickel alloy, and the fourth outer clad layer is roll bonded to the core layer.

According to an embodiment, the heat exchanger further comprises an object to be cooled, which has a metal layer having been bonded to the first outer clad layer by a metallurgical bond selected from a solder bond, an ultrasonic weld bond, or a sinter bond.

According to an embodiment, the object to be cooled is bonded to the first outer clad layer by a solder joint, and wherein the heat exchanger further comprises a layer of solder between the first outer clad layer and the metal layer of the object to be cooled.

In accordance with another aspect of the present disclosure, there is provided a brazed heat exchanger comprising: (a) a first plate having an inner surface and an outer surface; (b) a second plate having an inner surface and an outer surface; (c) a peripheral edge along which the inner surfaces of the first and second plates have been joined together by brazing at an aluminum brazing temperature; and (d) at least one fluid flow passage defined between the inner surfaces of the first and second plates. The first plate and the second plate each comprise a core layer, wherein the core layer comprises aluminum or an aluminum alloy, and has a melting temperature greater than an aluminum brazing temperature; and the first plate further comprises: a first outer clad layer defining the outer surface of the first plate, wherein the first outer clad layer is solderable to a metal layer of an object to be cooled and comprises nickel, a nickel alloy, copper or a copper alloy; and a second inner clad layer which is roll bonded directly to an opposite side of the core layer to the first outer clad layer, and which comprises nickel or a nickel alloy.

In accordance with another aspect of the present disclosure, there is provided a method for manufacturing a heat exchanger as described herein. The method comprises: (a) providing the first and second plates, wherein the first plate is comprised of a plurality of layers including the first outer clad layer, the second outer clad layer and the core layer, the layers of the first plate having been bonded together by roll bonding; (b) forming at least one of the first and second plates by a forming operation selected from stamping and drawing; (c) brazing the first plate to the second plate at the aluminum brazing temperature; and (d) bonding the metal layer of the object to be cooled to the outer surface of the first plate and to the first outer clad layer by a metallurgical bonding operation selected from soldering, ultrasonic welding, or sintering.

According to an aspect, the first plate further comprises a first inner clad layer comprising an aluminum alloy which melts and forms a filler metal at the aluminum brazing temperature, the first inner clad layer having been roll bonded to the core layer before step (a).

BRIEF DESCRIPTION OF THE DRAWINGS

Exemplary embodiments of the present disclosure will now be described, by way of example, with reference to the accompanying drawings, in which:

FIG. 7 is an enlarged cross-sectional side elevation of a portion of a heat exchanger according to another embodiment, having an object to be cooled mounted thereon.

DETAILED DESCRIPTION

Figure 1:
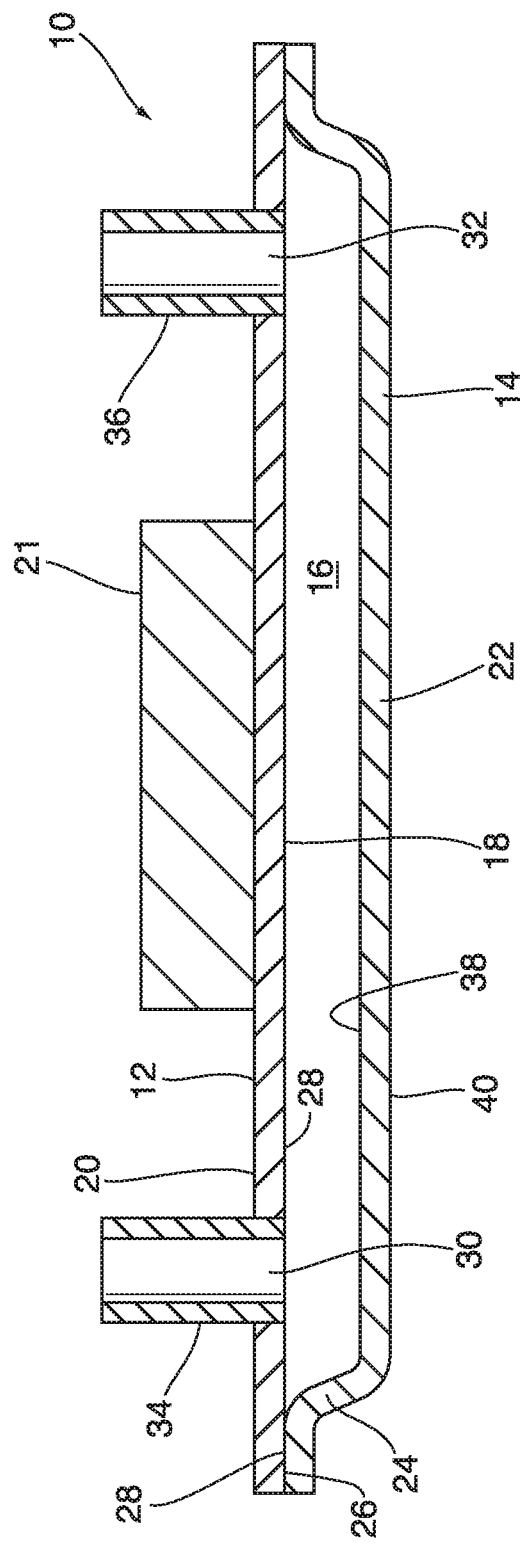
FIG. 1 is a cross-sectional side elevation of a heat exchanger according to an embodiment.

A heat exchanger 10 according to an embodiment is now described below with reference to the drawings.

Heat exchanger 10 comprises a first plate 12 and a second plate 14 sealed together at their peripheral edges, with areas of said first and second plates 12, 14 located inwardly of the peripheral edges being spaced apart to define at least one fluid flow passage 16 for a heat transfer fluid between the plates 12, 14.

At least the first plate 12 is a heat transfer plate having a first surface 18 (also referred to herein as the "inner surface") which is to be thermally contacted with a heat transfer fluid, and which faces toward the fluid flow passage 16 and the second plate 14. First plate 12 also has an opposed second surface 20 (also referred to herein as the "outer surface") to be contacted with at least one object 21 to be heated or cooled.

The second plate 14 of heat exchanger 10 is shaped, for example by stamping, and has a flat, planar base 22 surrounded on all sides by a raised peripheral flange 24 having a peripheral sealing surface 26 along which the second plate 14 is sealed to a peripheral sealing surface 28 on the inner surface 18 of the first plate 12, for example by brazing or welding. Second plate 14 has a first surface 38 (also referred to herein as the "inner surface") which is to be thermally contacted with a heat transfer fluid, and which faces toward the fluid flow passage 16 and the first plate 12, and an opposed second surface 40 (also referred to herein as the "outer surface"). Outer surface 40 may also be adapted for contact with at least one object 21 to be heated or cooled.

As used herein, the word "contact" used with reference to the outer surfaces 20, 40 of first and second plates 12, 14 means "thermal contact", in the sense that heat is transferred through first and/or second plate 12, 14, between the heat transfer fluid and the object 21 to be cooled. Unless specifically stated to the contrary, the word "contact", as used herein, is not to be interpreted as direct physical contact. Rather, it will be appreciated that surfaces or objects which are in thermal contact are not necessarily in direct physical contact with one another, but may rather be separated by an intermediate component, layer or substance. For example, the inner surface 18 of first plate 12 may be in thermal contact with the heat transfer fluid in fluid flow passage 16 through an intermediate plate, sheet or shim. Also, the outer surfaces 20, 40 of first and/or second plates 12, 14 may be in thermal contact with object 21 through an intermediate substance such as a layer of solder, which is identified by reference numeral 23 in FIG. 2, discussed below. This layer of solder 23 is also referred to herein as the "first solder layer".

The object to be cooled 21 comprises a heat-generating electronic component such as a transistor, resistor, capacitor, field effect transistor (FET), isolated gate bipolar transistor (IGBT) module or a substrate thereof, a power inverter, a DC to DC converter or a DC to AC converter. The object 21 may also include PCB boards with driving control logic, busbars, connectors, and an outer housing. Although one object 21 is shown in the drawings, it will be appreciated that a plurality of objects 21 may be provided on the outer surface 20 of first plate 12 and/or on the outer surface 40 of second plate 14.

Although heat exchanger 10 is described herein as having a specific configuration and function, it will be appreciated that the heat exchangers and manufacturing methods described herein are applicable to other types of heat exchangers which utilize flat plates, including heat-dissipating devices such as heat sinks in which one surface is for contact with an object to be cooled and an opposite surface is in contact with a stagnant or flowing coolant such as air, and which may be provided with cooling fins.

In the embodiment of FIG. 1, the inner and outer surfaces 18, 20 of first plate 12 are substantially flat and planar. Although the entire first plate 12 is shown as being flat and planar, this may not be the case in all embodiments. In some embodiments the first plate 12 may be flat and planar in areas which will be in contact with the object 21 to be cooled, but may be non-planar in other areas.

Figure 2:
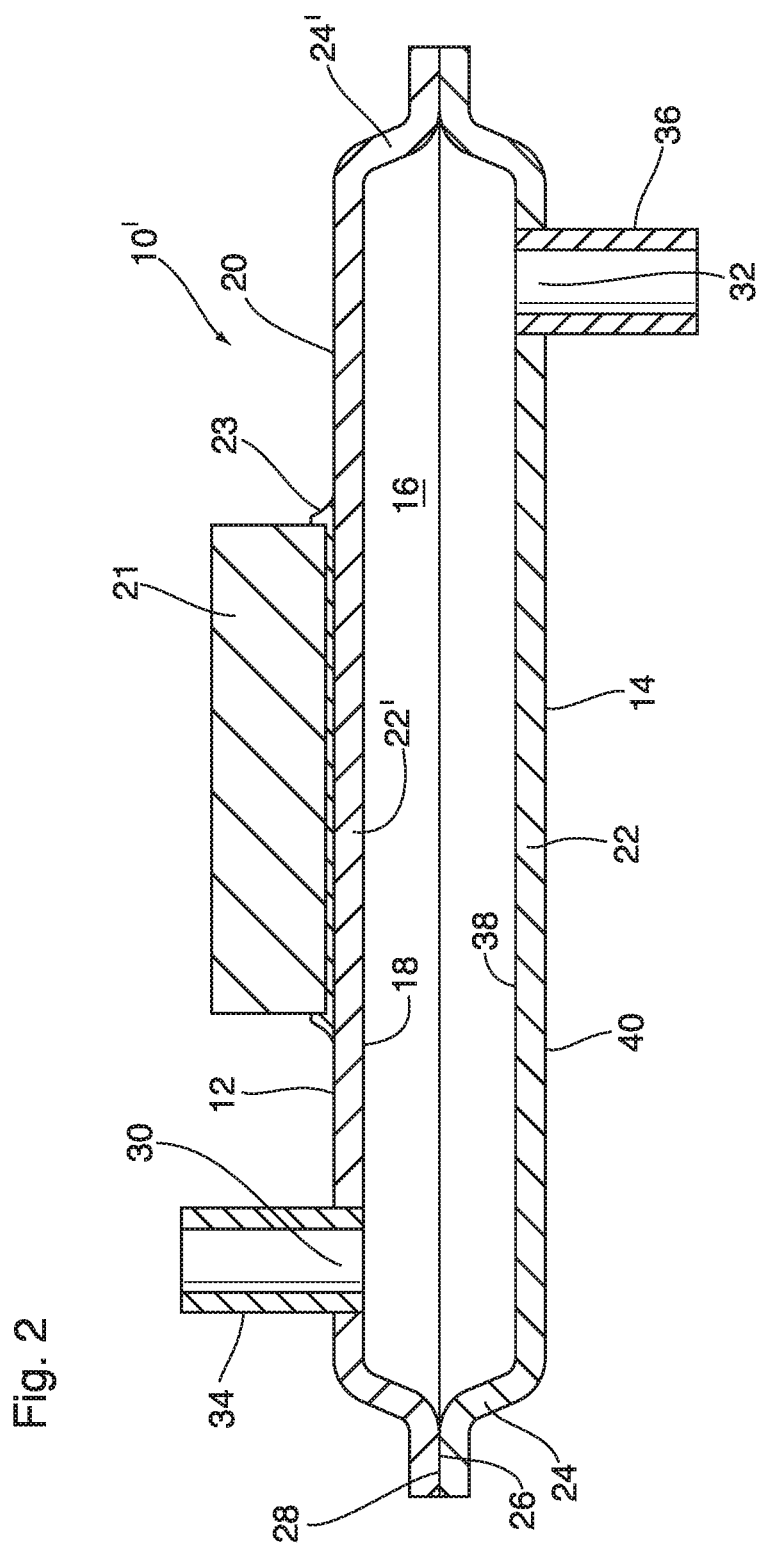
FIG. 2 is a cross-sectional side elevation of a heat exchanger according to an embodiment.

For example, FIG. 2 shows a heat exchanger 10' which is a variant of heat exchanger 10 in which the first plate 12 is a shaped plate formed with a flat, planar base 22' surrounded by a raised peripheral flange 24', similar to that of second plate 14.

Figure 3:
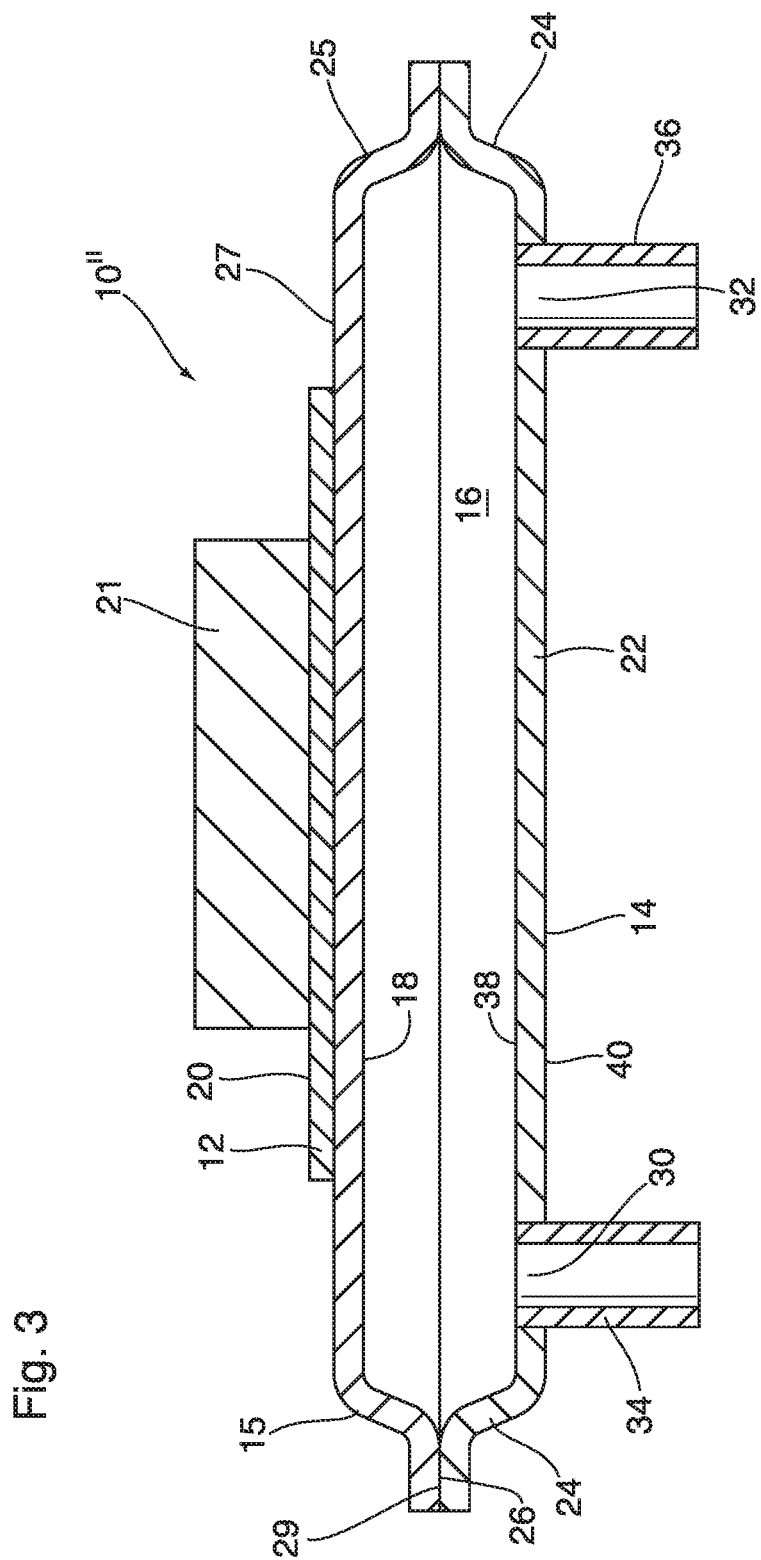
FIG. 3 is a cross-sectional side elevation of a heat exchanger according to an embodiment.

FIG. 3 shows a heat exchanger 10" which is another variant of heat exchanger 10 in which the first plate 12 comprises a heat sink in the form of a relatively thick, flat plate having its inner surface 18 fixed to a surface of a thinner shaped intermediate plate 15 which defines a wall of a fluid-carrying panel, as described in commonly assigned U.S. Pat. No. 10,475,724, which is incorporated herein by reference in its entirety. In this construction, the inner surface 18 of the first plate 12 is in thermal contact with a liquid coolant carried by the fluid-carrying panel through the thinner shaped plate 15, while the outer surface 20 of the heat sink 12 is in thermal contact with the object 21 to be cooled. The second plate 14 has a flat, planar base 22 surrounded on all sides by a raised peripheral flange 24 having a peripheral sealing surface 26, and heat exchanger 10" further comprises an intermediate plate 15 having a peripheral sealing surface 29 and a raised peripheral flange 25 surrounding a flat plate wall 27. The peripheral sealing surface 26 of the second plate 14 is sealed to the peripheral sealing surface 29 of the intermediate plate 15, for example by brazing, with the fluid flow passage 16 being defined between the second plate 14 and the intermediate plate 15. The first plate 12 may be flat and thicker than the second plate 14 and the intermediate plate 15, and the inner surface 18 of the first plate 12 may be fixed to the flat plate wall 27 of the intermediate plate 15, for example by brazing. In this embodiment, the inner surface 18 of the first plate 12 is separated from the fluid flow passage 16 by the flat plate wall 27 of the intermediate plate 15.

In some embodiments, the plates 12, 14, 15 comprised aluminum or alloys thereof, and are joined together by brazing, typically in a brazing furnace, with or without flux. In order to facilitate brazing, a braze filler metal is provided between the surfaces being joined. As will be further discussed below, the braze filler metal may be in the form of a clad layer on the sealing surfaces 26, 28 of the first plate 12 and/or the second plate 14, a shim interposed between sealing surfaces 26, 28, and/or a layer of clad brazing sheet interposed between sealing surfaces 26, 28. Thus, surfaces 26, 28 may not be in direct contact with one another, but rather may be sealed together through a layer of brazing filler metal and/or a brazing sheet.

The heat exchanger 10 also has inlet and outlet ports 30, 32 provided with inlet and outlet fittings 34, 36 to connect heat exchanger 10 to other components of a coolant circulation system (not shown). In heat exchanger 10 shown in FIG. 1, the inlet and outlet ports 30, 32 and fittings 34, 36 are provided in the first plate 12, and are located at opposite ends thereof, so that the coolant enters heat exchanger 10 through inlet port 30 and inlet fitting 34, then flows through the length of coolant flow passage 16 and exits the heat exchanger 10 through the outlet port 32 and outlet fitting 36. The location of ports 30, 32 and fittings 34, 36 shown in the drawings is not essential, and other configurations are possible. For example, the ports 30, 32 and fittings 34, 36 may both be located at the same end of the heat exchanger 10.

The object to be cooled 21 has a flat surface to provide intimate thermal contact with the outer surface 20, 40 of the first and/or second plate 12, 14. Heat produced by the object to be cooled 21 is transferred through the first plate 12 to the coolant circulating through coolant flow passage 16, either directly or through one or more intermediate layers as discussed above.

Although the heat exchanger 10 is shown in the drawings as having a specific configuration wherein the first and second plates 12, 14 are elongate and generally rectangular, and with ports 30, 32 and fittings 34, 36 located in the first plate 12, it will be appreciated that the drawings illustrate only a few possible configurations of heat exchangers. It will also be appreciated that the shapes of plates 12, 14 may be varied, and that one or both of the ports 30, 32 and their associated fittings 34, 36 may be located in the second plate 14, as shown in FIGS. 2 and 3. Furthermore, the relative thicknesses of the plates 12 and 14 are not accurately shown to scale in the drawings. In some applications, the first plate 12 may have a thickness which is significantly greater than the thickness of the second plate 14 and/or intermediate plate 15, where one is provided.

The illustrated embodiments show heat exchanger 10 as comprising a single fluid flow passage 16 enclosed by one pair of plates 12, 14 or 15. However, it will be appreciated that heat exchanger 10 may include additional pairs of plates 12, 14 or 12, 15. For example, heat exchanger 10 may include a second pair of plates 12, 14 or 12, 15 provided on top of the object to be cooled 21, and manifolds (not shown) may be provided to connect the coolant flow passages 16 of the two pairs of plates 12, 14. These manifolds may be provided in essentially the same locations that are occupied by fittings 34, 36 in the illustrated embodiment, or they may be provided externally of the plates 12, 14, 15. Heat exchanger structures including multiple pairs of plates are shown in commonly assigned U.S. Pat. Nos. 9,417,011, 9,829,256 and 10,475,724, the latter disclosing a configuration where the manifolds are provided in a structure which is external to the fluid-carrying panels.

Having now described the basic structure of heat exchanger 10, the following discussion focuses on the layered structure of the heat exchanger plates 12, 14 and the object 21 to be cooled.

In the following discussion, it will be assumed that the plates 12, 14, 15 comprising heat exchanger 10 are comprised of a brazeable aluminum alloy, with 3000 series wrought aluminum alloys being most commonly used as the core layer of aluminum heat exchanger plates 12, 14 and/or 15, with 3003 and 3005 aluminum alloy being widely used in the industrial production of heat exchangers. The 3000 series aluminum alloys comprise aluminum alloyed with manganese and have higher strength than pure aluminum while maintaining good formability and corrosion resistance. The melting point of 3000 series aluminum alloys is about 629-654° C. (1165-1210° F.). Alternatively, in some applications, the core layers of plates 12, 14 and/or 15 may comprise other, less conventional, alloys such as 1000, 2000, 5000, 6000, 7000 and 8000-series alloys or aluminum casting alloys.

One or more of plates 12, 14, 15 may further comprise a surface layer or cladding comprised of a lower-melting aluminum alloy, such as a 4000 series wrought aluminum alloy comprising aluminum and silicon, with 4043 aluminum alloy being widely used as a brazing filler metal alloy in the industrial production of heat exchangers. The melting range of 4043 aluminum alloy is from about 573-625° C. The clad layer may be provided with one or more electroplated layers, including nickel, to permit fluxless brazing of aluminum, for example as disclosed in commonly assigned U.S. Pat. Nos. 7,000,823 and 6,913,184, the contents of which are incorporated herein by reference in their entireties.

To be defined as brazing, the braze alloy liquidus temperature must be below the melting point of the core layer of the plate 12, 14 and/or 15, and above 450° C. (842° F.). As defined herein, the aluminum brazing temperature is defined as the temperature at which the plates 12, 14, 15 of heat exchanger 10 are brazed together, and within the range of about 550-615° C.

Figure 4:
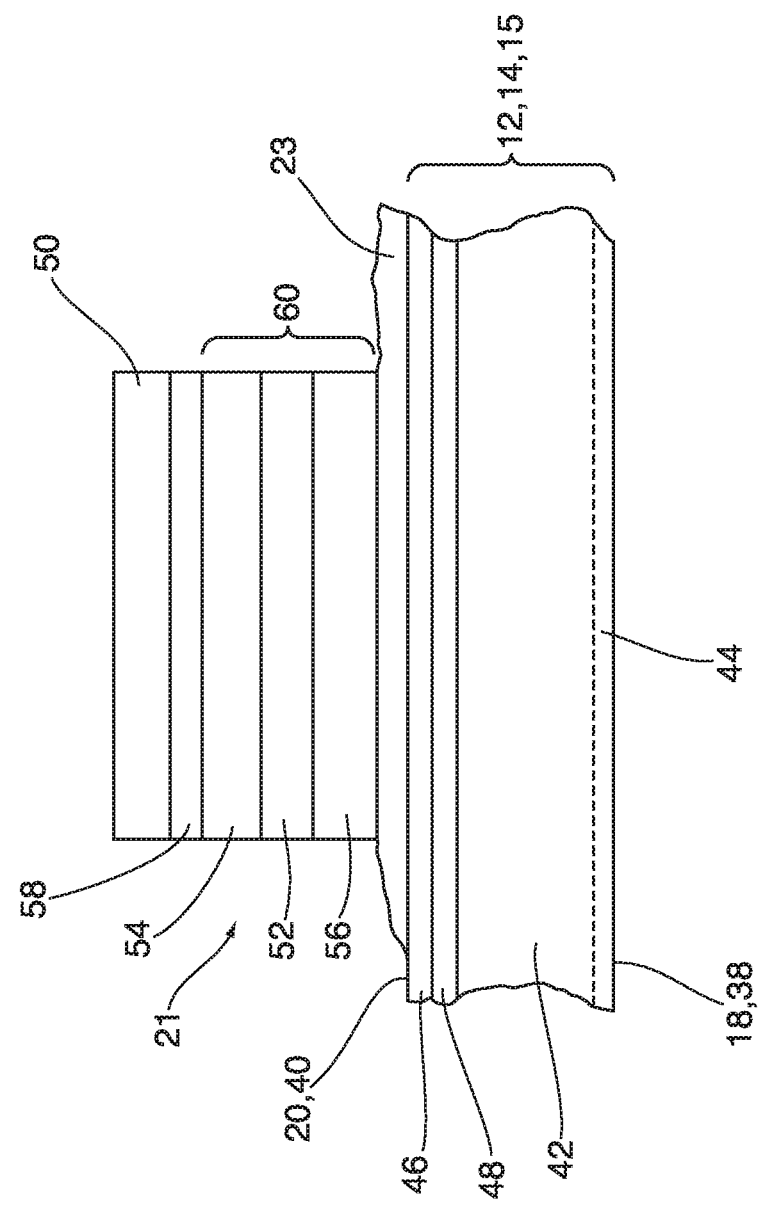
FIG. 4 is an enlarged cross-sectional side elevation of a portion of a heat exchanger according to an embodiment, having an object to be cooled mounted thereon.

FIG. 4 is a close-up cross-sectional view which schematically illustrates an object 21 which is mounted to the external surface 20, 40 of one of the plates 12, 14, 15 of a heat exchanger 10 as described herein. FIG. 4 schematically illustrates the various layers of the plates 12, 14, 15 and the object 21 to be cooled. It will be appreciated that the thicknesses of the various layers are not shown to scale.

The plate 12, 14, 15 is shown as having a core layer 42 sandwiched between a first inner clad layer 44 and a first outer clad layer 46, wherein clad layers 44, 46 are provided along the respective inner surface 18, 38 and outer surface 20, 40 of plate 12, 14, 15.

The core layer 42 is comprised of a brazeable aluminum alloy, meaning that the core layer 42 has a melting (liquidus) temperature sufficiently high that it remains solid and does not melt at brazing temperatures, i.e. above 450° C. (842° F.), and for example above 625° C. The core layer 42 may comprise 1000, 2000, 3000, 5000, 6000, 7000 or 8000-series alloys or aluminum casting alloys. For example, the core layer may comprise a 3000 series wrought aluminum alloy such as 3003 or 3005 aluminum alloy. The thickness of the core layer 42 is variable, and may range from about 0.5 mm to about 2.5 mm.

Figure 5:
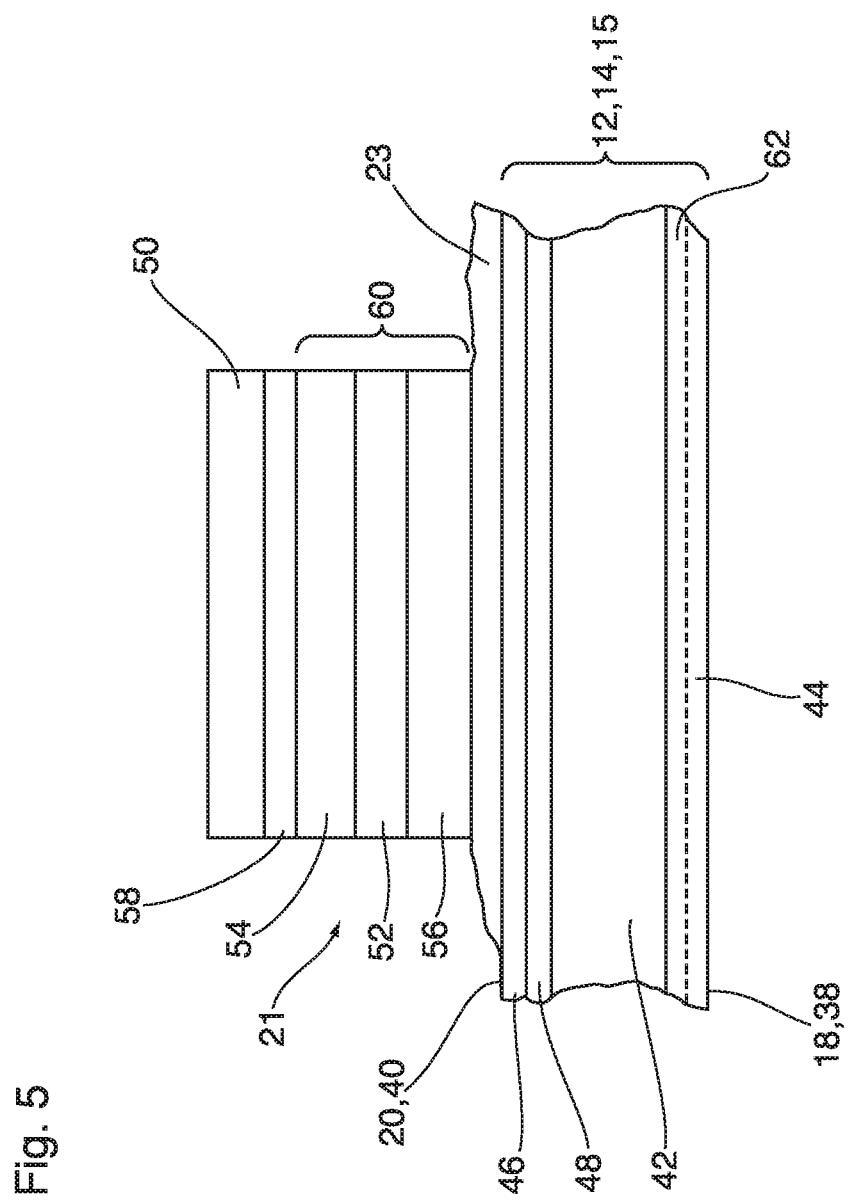
FIG. 5 is an enlarged cross-sectional side elevation of a portion of a heat exchanger according to another embodiment, having an object to be cooled mounted thereon.
Figure 6:
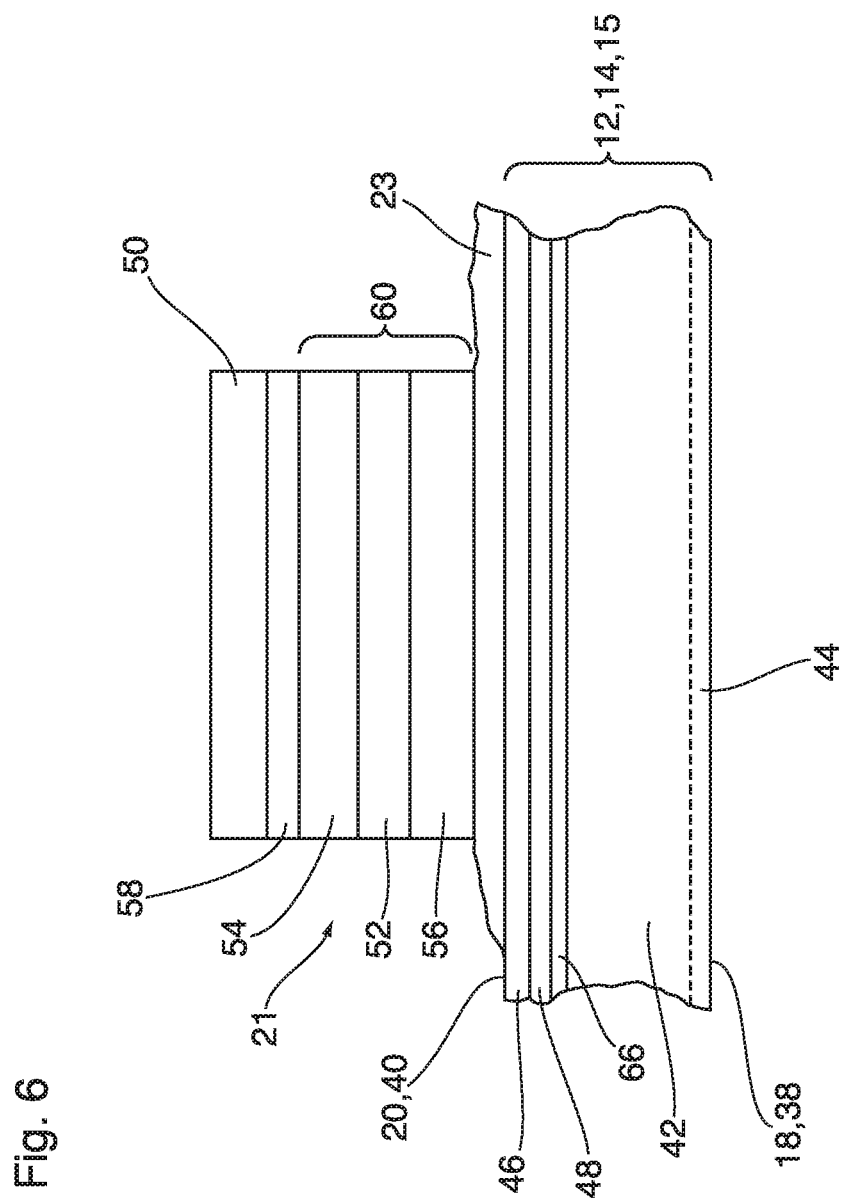
FIG. 6 is an enlarged cross-sectional side elevation of a portion of a heat exchanger according to another embodiment, having an object to be cooled mounted thereon.

The first inner clad layer 44 is comprised of a lower-melting aluminum alloy which melts and forms a filler metal at brazing temperatures, such as a 4000 series wrought aluminum alloy comprising aluminum and silicon, for example 4043 aluminum alloy. Therefore, the first inner clad layer 44 may be at least partially consumed during brazing of the heat exchanger 10, and the interface between layer 44 and the adjacent layers of plate 12, 14, 15 is shown in FIGS. 4-6 with a dotted line.

As discussed above, the first inner clad layer 44 is optional. Instead, some embodiments may utilize shims or preforms having the same or similar composition and thickness as first inner clad layer 44, which is typically in the range from about 10-100 μm.

The first outer clad layer 46 is comprised of metal, and remains intact during a brazing operation in which the heat exchanger 10 is assembled. Therefore, the metal(s) comprising the first outer clad layer 46 is applied to plate 12, 14 or 15 before brazing, and has a sufficiently high melting point that it does not melt during brazing.

In addition, the metal(s) comprising first outer clad layer 46 is solderable, meaning that the first outer clad layer 46 is capable of forming a solder joint with the object 21 to be cooled, i.e. after brazing. In order to form a solder joint, the first outer clad layer 46 must be "wetted" by the solder. In this regard, when the first outer clad layer 46 and a solder composition are heated to a soldering temperature (defined as being below 450° C. or 842° F.), the solder composition will melt and "wet" the outer surface of the first outer clad layer 46, meaning that the molten solder penetrates the surface of the first outer clad layer 46 to form the first solder layer 23 which is intermetallically bonded to the outer surface of the first outer clad layer 46.

In some embodiments, the first outer clad layer 46 is bondable to object 21 without the use of solder layer 23. In this regard, the first outer clad layer 46 may be bonded to object 21 by sintering, or by acoustic/ultrasonic bonding or welding.

In the present embodiment the first outer clad layer 46 comprises nickel, a nickel alloy, copper or a copper alloy. Nickel melts at 1,455° C. and copper melts at 1,085° C., and therefore the outer clad layer has a sufficiently high melting point that it remains intact during brazing. Copper, nickel and their alloys are also solderable, and are wetted by solder compositions. The thickness of the first outer clad layer 46 is variable, and may be about 25-250 μm, for example about 25-150 μm or about 50-100 μm.

Copper and aluminum form a eutectic composition melting at about 548° C., which is lower than the temperature at which the plates 12, 14, 15 of heat exchanger 10 are brazed together, particularly where they comprise 3000 series aluminum alloys. Therefore, in embodiments where the first outer clad layer 46 comprises copper or copper alloy, it is undesirable to have the first outer clad layer 46 in direct contact with the core layer 42 of the plate 12, 14, 15 to which it is bonded for the reason that, during brazing, the copper of first outer clad layer 46 will combine with aluminum of core layer 42 to form a eutectic composition, which may at least partially melt during brazing. The formation and melting of the eutectic composition during brazing effectively erodes and reduces the thickness of the core layer 42, and negatively affects the structural integrity of the heat exchanger 10.

Therefore, in embodiments where the first outer clad layer 46 comprises copper or a copper alloy, a second outer clad layer 48 is provided between the inner surface of the first outer clad layer 46 and the aluminum core layer 42. The second outer clad layer 48 provides a barrier between the copper-based first outer clad layer 46 and the aluminum core layer 42 of plate 12, 14, 15. Therefore, the second outer clad layer 48 is comprised of a metal which is bondable to both aluminum and copper, which does not form a low-melting eutectic with aluminum or copper at brazing temperatures, and which has a sufficiently high melting temperature to remain in solid form at brazing temperatures, and which has sufficient thickness to maintain its structural integrity during brazing.

For example, the second outer clad layer 48 may be comprised of nickel, a nickel alloy, stainless steel, high nickel steel, or mild steel. The thickness of the second outer clad layer 48 is variable, and may be from about 10-150 μm, for example about 50-100 μm. Where the second outer clad layer 48 comprises nickel or a nickel alloy, the second outer clad layer 48 has a thickness from greater than 10 μm to about 150 μm, for example from greater than 10 μm to about 100 μm, or greater than 10 μm to about 50 μm.

Where the metal(s) comprising the first outer clad layer 46 does not form a low-melting eutectic composition with aluminum during brazing, the second outer clad layer 48 may be omitted. Therefore, in embodiments where the first outer clad layer 46 comprises nickel or a nickel alloy, the first outer clad layer 46 may be directly bonded to the core layer 42 of plate 12, 14 or 15.

The first solder layer 23 comprises a metal composition having a melting point within the range of 90-450° C., and having variable composition. Typical elements present in solder compositions include tin, lead, copper, silver, bismuth, indium, zinc, antimony, cadmium, aluminum, etc. Typically, the melting point of the solder composition will be within the range from about 150° C. to about 400° C.

In some embodiments the outer surface of the first outer clad layer 46 may be "tinned", i.e. at least a portion of the solder composition comprising first solder layer 23, or a different solder composition, is applied as a thin, continuous layer to the outer surface of the first outer clad layer 46 before soldering the object 21 to the heat exchanger 10. The tinning helps some metals to form a solder joint, and is advantageous where the first outer clad layer 46 comprises nickel or a nickel alloy. The right side of FIG. 4 shows first solder layer 23 extending outwardly beyond the edges of object 21 as a continuous layer, consistent with tinning. By way of contrast, the left side of FIG. 4 shows that the first solder layer 23 may extend only throughout the area of the base of object 21 and the immediate vicinity thereof.

A flux may be used to break up the oxide layer on the outer surface of first outer clad layer 46, before and/or during the tinning operation, if used, and before and/or during the soldering of the object 21 to the plate 12, 14, 15.

The object 21 to be cooled comprises a plurality of layers, which are illustrated in FIGS. 4 and 5. Generally speaking, the object 21 comprises at least one semiconductor chip 50 mounted to an electrically insulating substrate 52, and includes additional layers to allow bonding of the chip 50 to the substrate 52, and bonding of the substrate 52 to the plate 12, 14, 15. The substrate 52 may comprise a ceramic such as silicon nitride ($Si_3N_4$), aluminum oxide ($Al_2O_3$) or aluminum nitride (AlN).

In the illustrated embodiment, the electrically insulating substrate 52 is provided with layers of solderable metal such as copper. These upper and lower metal layers are identified by reference numerals 54 and 56, and provide solderable surfaces for bonding to the surfaces of adjacent components, and/or to provide electrical conductance. Where the metal layers 54, 56 comprise copper and the substrate 52 comprises ceramic, the layers 54/52/56 are typically referred to as the DBC (direct bonded copper) layer, which is identified in the drawings by reference numeral 60. Between the chip 50 and the upper metal layer 54 is a second solder layer 58.

The compositions of the first and second solder layers 23, 58 may be different and may have different melting temperatures. For example, where the DBC layer 60 is first applied to plate 12, 14, 15 (i.e. before application of chip 50 to DBC layer 60), the first solder layer 23 will have a higher melting point than the second solder layer 58. Alternatively, where the DBC layer 60 is first populated with one or more chips 50 before it is bonded to plate 12, 14, 15, the melting point of the second solder layer 58 will be higher than that of the first solder layer 23.

In contrast to known heat exchangers where a layer of TIM is provided between object 21 and plate 12, 14, 15, the direct bonding of object 21 to plate 12, 14, 15, as described herein, provides a direct thermal bond which reduces thermal resistance between the object 21 (including chip 50) and the heat transfer fluid circulating through the at least one fluid flow passage 16 of heat exchanger 10. This permits the object 21 to operate at a lower temperature, and/or allows more energy to be passed through the object 21 at a given temperature of the heat transfer fluid.

FIG. 5 illustrates another embodiment which is identical to that illustrated in FIG. 4, except that the plate 12, 14, 15 includes a further metal layer 62, also referred to herein as the "second inner clad layer" proximate to the inner surface 18, 38 thereof.

It will be appreciated that aluminum, copper and nickel have different rates of thermal expansion when heated to high temperatures, for example during brazing. Therefore, due to its multi-layer structure, with layer 46 and optionally layer 48 on one side of an aluminum core layer 42, the plate 12, 14 or 15 may be prone to warping or bowing when heated to the brazing temperature range, due to the forces produced by differential thermal expansion of the core layer 42, the first outer clad layer 46, and the second outer clad layer 48 (where one is provided). For example, the inner surfaces 18, 38 of plates 12, 14 may be concavely warped, whereas outer surface 20, 40 may be convexly warped. Any warping of plates 12, 14, 15 is undesirable as it may affect the flatness of the sealing surfaces of plates 12, 14, 15, making it more difficult to braze them together with a fluid-tight seal. In addition, warping of the outer surfaces of plates 12, 14 will reduce thermal contact with any objects 21 which are subsequently bonded to the plates 12, 14.

The second inner clad layer 62 is applied to the opposite (inner) side of plate 12, 14 or 15 to balance forces produced by differential thermal expansion of the layers, thereby reducing the tendency of plate 12, 14 or 15 to warp or bow during brazing.

As shown, the second inner clad layer 62 may be applied directly to the core layer 42. In embodiments where a first inner clad layer 44 is provided, the second inner clad layer 62 is provided between the core layer 42 and the first inner clad layer 44. The second clad layer 62 has a similar coefficient of thermal expansion as the first outer clad layer 46 and/or the second outer clad layer 48, and may optionally comprise the same metal(s) as the first outer clad layer 46 and/or the second outer clad layer 48. For example, in embodiments where the first outer clad layer 46 or the second outer clad layer 48 are comprised of nickel or a nickel alloy, the second inner clad layer 62 may similarly be comprised of nickel or a nickel alloy. The thickness of the second inner clad layer 62 may be within the above-mentioned thickness ranges of the first outer clad layer 46 and/or the second outer clad layer 48.

There are a number of known methods for applying the layers 44, 46, 48 and 62 to the aluminum core layer 42. For example, the layers may be applied by plating or spraying the metals comprising these layers onto the core layer 42. However, the inventors have found that the most economical and effective method for applying the layers to the core layer 42 is by roll bonding.

Roll bonding is a solid state cold welding process whereby two or more sheets of metal are passed through a pair of flat rollers under sufficient pressure to bond the layers together, followed by heat treatment (annealing). Roll bonding may also reduce the thickness of one or more of the metal sheets. In the context of the present invention, a first sheet of metal comprising the core layer 42 is roll bonded to one or more metal sheets comprising the various clad layers, in one or more roll bonding operations.

For example, where the core layer 42 comprises aluminum or an aluminum alloy, and the first outer clad layer 46 comprises nickel or a nickel alloy, the first outer clad layer 46 is roll bonded directly to the core layer 42. Also, the first outer clad layer 46 may be applied in the same roll bonding as one or more of the inner clad layers 44, 62, or in a different roll bonding operation.

Where the plate 12, 14, 15 includes both first and second inner clad layers 44, 62, these inner clad layers may be applied simultaneously or sequentially to the core layer 42 by roll bonding, i.e. with the second inner clad layer 62 applied directly to the aluminum core layer 42 and the first inner clad layer 44 applied to the second inner clad layer 62. Alternatively, the first and second inner clad layers 44, 62 may first be roll bonded to each other and subsequently roll bonded together to the aluminum core layer 42. In embodiments where no second inner clad layer 62 is provided, the first inner clad layer 44 is roll bonded directly to the aluminum core layer 42.

Where the first outer clad layer 46 comprises copper or a copper alloy, and a second outer clad layer 48 is provided between the first outer clad layer 46 and the aluminum core layer 42, a sheet comprising the second outer clad layer 48 may first be roll bonded to the aluminum core layer 42, with a sheet comprising the first outer clad layer 46 being roll bonded to the second outer clad layer 48 in the same roll bonding operation, or in a subsequent roll bonding operation. Alternatively, metal sheets comprising the first outer clad layer 46 and the second outer clad layer 48 may be bonded together in a first roll bonding operation to form a multilayer cladding sheet, and then the multilayer cladding sheet is roll bonded to the aluminum core layer 42, such that the second outer clad layer 48 is in direct contact with the core layer 42.

FIG. 6 illustrates another embodiment which is similar to the embodiment of FIG. 4, in which the first outer clad layer 46 comprises nickel or nickel alloy, and which includes a second outer clad layer 48 and a third outer clad layer 66. With the addition of the second and third outer clad layers 48, 66, it can be seen that the aluminum core layer 42 is provided with an outer clad structure comprising Ni/Al/Ni. The inventors have found that the application of outer clad layers 46, 48, 66 of this composition, arranged in this sequence, balances the forces caused by differential thermal expansion of aluminum and nickel, thereby reducing or eliminating warping or bowing of plate 12, 14, 15, as in the embodiment of FIG. 5.

The thickness of the first outer clad layer 46 may be as described above, and the third outer clad layer 66, comprising nickel or nickel alloy, may have the same or similar thickness as layer 46, for example within about ±25%. The second outer clad layer 48, comprised of aluminum or aluminum alloy, will typically be thinner than the core layer 42. However, the thicknesses of layers 42 and 48 may be adjusted somewhat in order to ensure optimal balancing of forces and flatness of plate 12, 14, 15.

FIG. 7 illustrates another embodiment which is similar to the embodiment of FIG. 6, except that the first outer clad layer 46 comprises copper or a copper alloy, and the plate further comprises second, third and fourth outer clad layers 48, 66, 68. In this embodiment, the second and fourth outer clad layers 48, 68 comprise nickel or nickel alloy, and the third outer clad layer 66 comprises aluminum or an aluminum alloy. Therefore, the embodiment of FIG. 7 is analogous to the embodiment of FIG. 4, except that second outer clad layer 48 is replaced by a clad structure comprising Ni/Al/Ni to balance the forces caused by differential thermal expansion of aluminum and nickel, thereby reducing or eliminating warping or bowing of plate 12, 14, 15.

A heat exchanger 10 may be manufactured by the steps set out below.

Firstly, a plurality of metal sheets 12, 14, 15 are provided, the metal sheets comprising aluminum or an aluminum alloy.

As explained above, a layer of an aluminum brazing alloy such as first inner clad layer 44 may be applied to one or more of the metal sheets 12, 14, 15.

Any of the plates 12, 14, 15 which will be soldered to an object 21 are provided with a first outer clad layer 46 which is applied to the core layer 42 by roll bonding. Where the same plate 12, 14, 15 is also provided with a first inner clad layer 44, the first outer clad layer 46 and the first inner clad layer 44 are applied to the core layer 42 in the same roll bonding operation, or in different roll bonding operations.

Where a second outer clad layer 48 is provided, the second outer clad layer 48 is roll bonded directly to the core layer 42 either before or after the second outer clad layer 48 and the outer clad layer 46 are roll bonded together. Similarly, where a third outer clad layer 66 is provided, the first, second and third outer clad layers 46, 48, 66 may first be roll bonded together to form a Ni/Al/Ni, which is then roll bonded to the core layer 42, or they may be roll bonded to the core layer 42 in two or more roll bonding operations.

Where a plate 12, 14, 15 is provided with a second inner clad layer 62, the second inner clad layer 62 is roll bonded directly to the core layer 42 of the plate 12, 14, 15. Where the same plate 12, 14, 15 is provided with first inner clad layer 44, the second inner clad layer 62 is roll bonded directly to the core layer 42 either before or after the first and second inner clad layers 44, 62 are roll bonded together.

After the first outer clad layer 46 and any of the other layers are applied to one or more of the plates 12, 14, 15, at least one of the plates undergoes one or more forming operations, such as machining, stamping or drawing. The forming operation provides the plate 12, 14, 15 with one or more features which at least partially define the one or more fluid flow passages 16. Such features include holes (e.g. for ports 30, 32), flat planar base 22, raised peripheral flange 24, peripheral sealing surfaces 26, 28, and/or one or more embossments (not shown) in the planar base 22, including ribs and dimples, which partly define the at least one fluid flow passage 16 and guide the heat transfer fluid through the heat exchanger 10 from inlet to outlet.

In some embodiments the first outer clad layer 46 is applied only to the first plate 12, and optionally one or both of the layers 48 and 62 are applied only to first plate 12. In the embodiment of FIG. 1, the first outer clad layer 46 and optional first plate 12 may be stamped to form ports 30, 32, but otherwise maintained flat and planar. In such embodiments, the formabilities of the layers 46, 48 and 62 are not of particular concern, and the thicknesses of these clad layers may be closer to the lower ends of the above-mentioned thickness ranges.

On the other hand, where the first plate 12 undergoes additional forming, as in FIG. 2 or 3, or where a first outer clad layer 46 is also applied to the second plate 14, the first outer clad layer 46 and any of the other clad layers must remain intact during the forming operation. In such embodiments, the thicknesses of the clad layers 46, 48, 62 may be closer to the upper ends of the thickness ranges mentioned above. For example, where any of clad layers 46, 48, 62 is nickel or nickel alloy, the clad layer may have a thickness of about 25-250 μm, for example about 25-150 μm or about 50-100 μm, if it will be subjected to a forming operation.

After the plates 12, 14, 15 are clad and shaped as described above, the plates 12, 14, 15 are held together, typically with a jig or fixture, and are heated to brazing temperature in a brazing furnace. Braze filler metal provided between the plates 12, 14, 15 (including first inner clad layer 44) melts and forms seals between the plates 12, 14, 15.

After brazing the heat exchanger 10 is cooled and one or more objects 21 to be cooled are then soldered to the outer surfaces of heat exchanger 10 provided with a first outer clad layer 46. As mentioned above, the first outer clad layer 46 may be pretreated (after brazing) by tinning the outer surface thereof. A flux may be used to solder the one or more objects 21 to the heat exchanger 10. Also as mentioned above, the semiconductor chip(s) 50 may be soldered to the DBC layer 60 of the object 21 either before or after the object 21 is soldered to the heat exchanger.

While various embodiments have been described in connection with the present disclosure, it will be understood that certain adaptations and modifications of the described exemplary embodiments can be made as construed within the scope of the present disclosure. Therefore, the above discussed embodiments are considered to be illustrative and not restrictive.

What is claimed is:

1. A brazed heat exchanger comprising:
   (a) a first plate having an inner surface and an outer surface;
   (b) a second plate having an inner surface and an outer surface;
   (c) a peripheral edge along which the inner surfaces of the first and second plates have been joined together by brazing at an aluminum brazing temperature; and
   (d) at least one fluid flow passage defined between the inner surfaces of the first and second plates;
   wherein the first plate and the second plate each comprise a core layer, wherein the core layer comprises aluminum or an aluminum alloy, and has a melting temperature greater than an aluminum brazing temperature;
   wherein the first plate further comprises:
   a first outer clad layer defining the outer surface of the first plate,
   wherein the first outer clad layer is solderable to a metal layer of an object to be cooled and comprises nickel, a nickel alloy, copper or a copper alloy; and
   a second outer clad layer located between the first outer clad layer and the core layer, wherein the first outer core clad layer is roll bonded to the second outer clad layer.

2. The heat exchanger according to claim 1, wherein the first outer clad layer has a thickness of about 25-250 μm.

3. The heat exchanger according to claim 1, wherein the first outer clad layer comprises copper or a copper alloy; wherein the second outer clad layer is roll bonded to the core layer and to the first outer clad layer; and wherein the second outer clad layer comprises nickel, a nickel alloy, stainless steel, high nickel steel, or mild steel.

4. The heat exchanger according to claim 3, wherein the second outer clad layer comprises nickel or nickel alloy.

5. The heat exchanger according to claim 4, wherein the second outer clad layer has a thickness from greater than 10 μm to about 150 μm.

6. The heat exchanger according to claim 3, wherein the first outer clad layer has a thickness of about 50-150 μm.

7. The heat exchanger according to claim 1, wherein the first outer clad layer comprises nickel or a nickel alloy and has a thickness of about 25-250 μm.

8. The heat exchanger according to claim 7, wherein the second outer clad layer comprises aluminum or an aluminum alloy and has a melting temperature greater than said aluminum brazing temperature; and
   wherein the first plate further comprises a third outer clad layer; wherein the third outer clad layer is roll bonded to the second outer clad layer; and wherein the third outer clad layer comprises nickel or a nickel alloy.

9. The heat exchanger according to claim 8, wherein the third outer clad layer is also roll bonded to the core layer.

10. The heat exchanger according to claim 9, wherein a thickness of the first outer clad layer is the same as a thickness of the third outer clad layer, or the thicknesses of the first and third layers are within about ±25% of each other.

11. The heat exchanger according to claim 10, wherein the second outer clad layer is thinner than the core layer.

12. The heat exchanger according to claim 1, wherein the first plate further comprises a first inner clad layer defining the inner surface of the first plate and comprising an aluminum alloy which melts and forms a filler metal at said aluminum brazing temperature.

13. The heat exchanger according to claim 1, wherein the first plate further comprises a second inner clad layer which is roll bonded directly to an opposite side of the core layer to the first outer clad layer, and which comprises nickel or a nickel alloy.

14. The heat exchanger according to claim 3, wherein the first plate further comprises a third outer clad layer roll bonded to the second outer clad layer, and a fourth outer clad layer roll bonded to the third outer clad layer;
   wherein the third outer clad layer comprises aluminum or an aluminum alloy and has a melting temperature greater than said aluminum brazing temperature; and
   wherein the fourth outer clad layer comprises nickel, a nickel alloy, stainless steel, high nickel steel, or mild steel.

15. The heat exchanger according to claim 14, wherein both the second and the fourth outer clad layers comprise nickel or nickel alloy, and the fourth outer clad layer is roll bonded to the core layer.

16. The heat exchanger according to claim 1, further comprising an object to be cooled, the object to be cooled having a metal layer having been bonded to the first outer clad layer by a metallurgical bond selected from a solder bond, an ultrasonic weld bond, or a sinter bond.

17. The heat exchanger according to claim 13, wherein the object to be cooled is bonded to the first outer clad layer by a solder joint, and wherein the heat exchanger further comprises a layer of solder between the first outer clad layer and the metal layer of the object to be cooled.

18. A brazed heat exchanger comprising:
   (a) a first plate having an inner surface and an outer surface;
   (b) a second plate having an inner surface and an outer surface;
   (c) a peripheral edge along which the inner surfaces of the first and second plates have been joined together by brazing at an aluminum brazing temperature; and
   (d) at least one fluid flow passage defined between the inner surfaces of the first and second plates;
   wherein the first plate and the second plate each comprise a core layer, wherein the core layer comprises aluminum or an aluminum alloy, and has a melting temperature greater than an aluminum brazing temperature;
   wherein the first plate further comprises:
   a first outer clad layer defining the outer surface of the first plate,
   wherein the first outer clad layer is solderable to a metal layer of an object to be cooled and comprises nickel, a nickel alloy, copper or a copper alloy; and
   a second inner clad layer which is roll bonded directly to an opposite side of the core layer to the first outer clad layer, and which comprises nickel or a nickel alloy.

19. The heat exchanger according to claim 18, wherein the first outer clad layer comprises nickel or a nickel alloy and has a thickness of about 25-250 μm.

20. The heat exchanger according to claim 19, wherein the first plate further comprises a first inner clad layer defining the inner surface of the first plate and comprising an aluminum alloy which melts and forms a filler metal at said aluminum brazing temperature; and
   wherein the second inner clad layer is roll bonded directly to an opposite side of the core layer to the first outer clad layer.

21. A method for manufacturing a heat exchanger according to claim 1, the method comprising:
   (a) providing the first and second plates, wherein the first plate is comprised of a plurality of layers including the first outer clad layer, the second outer clad layer and the core layer, the layers of the first plate having been bonded together by roll bonding;

(b) forming at least one of the first and second plates by a forming operation selected from stamping and drawing;

(c) brazing the first plate to the second plate at said aluminum brazing temperature; and (d) bonding the metal layer of the object to be cooled to the outer surface of the first plate and to the first outer clad layer by a metallurgical bonding operation selected from soldering, ultrasonic welding, or sintering.

22. The method according to claim 21, wherein the first plate further comprises a first inner clad layer comprising an aluminum alloy which melts and forms a filler metal at said aluminum brazing temperature, the first inner clad layer having been roll bonded to the core layer before said step (a).

* * * * *